(12) United States Patent
Muchherla et al.

(10) Patent No.: US 10,579,468 B2
(45) Date of Patent: *Mar. 3, 2020

(54) TEMPERATURE RELATED ERROR MANAGEMENT

(71) Applicant: Micron Technology, Inc., Boise, ID (US)

(72) Inventors: Kishore K. Muchherla, San Jose, CA (US); Sampath K. Ratnam, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/118,524

(22) Filed: Aug. 31, 2018

(65) Prior Publication Data

US 2019/0012226 A1 Jan. 10, 2019

Related U.S. Application Data

(63) Continuation of application No. 14/644,365, filed on Mar. 11, 2015, now Pat. No. 10,078,546.

(Continued)

(51) Int. Cl.
*G06F 11/08* (2006.01)
*G06F 11/30* (2006.01)
(Continued)

(52) U.S. Cl.
CPC .......... *G06F 11/08* (2013.01); *G06F 11/1048* (2013.01); *G06F 11/30* (2013.01); *G06F 11/3034* (2013.01); *G06F 11/3058* (2013.01); *G11C 7/04* (2013.01); *G11C 16/10* (2013.01); *G11C 29/028* (2013.01); *G06F 2201/81* (2013.01); *G11C 2029/0411* (2013.01)

(58) Field of Classification Search
CPC ...... G06F 11/08; G06F 11/1048; G06F 11/30; G06F 11/3034; G06F 11/3058; G06F 2201/81; G11C 7/04; G11C 16/10; G11C 29/028; G11C 2029/0411
See application file for complete search history.

(56) References Cited

U.S. PATENT DOCUMENTS 7,280,141 B1 10/2007 Frank et al.
2003/0151950 A1* 8/2003 Tamada .............. G11C 11/5628
365/185.19

(Continued)

*Primary Examiner* — April Y Blair
*Assistant Examiner* — Dipakkumar B Gandhi
(74) *Attorney, Agent, or Firm* — Brooks, Cameron & Huebsch, PLLC

(57) ABSTRACT

Apparatuses and methods for temperature related error management are described. One or more apparatuses for temperature related error management can include an array of memory cells and a write temperature indicator appended to at least one predetermined number of bytes of the stored data in the array of memory cells. The apparatuses can include a controller configured to determine a numerical temperature difference between the write temperature indicator and a read temperature indicator and determine, from stored operations, an error management operation for the stored data based, at least in part, on comparison of the numerical temperature difference to a temperature difference threshold.

20 Claims, 3 Drawing Sheets

Related U.S. Application Data

(60) Provisional application No. 62/068,267, filed on Oct. 24, 2014.

(51) Int. Cl.
*G11C 7/04* (2006.01)
*G11C 16/10* (2006.01)
*G11C 29/02* (2006.01)
*G06F 11/10* (2006.01)
*G11C 29/04* (2006.01)

(56) References Cited

U.S. PATENT DOCUMENTS

| | | |
|---|---|---|
| 2004/0264030 A1 | 12/2004 | Yang |
| 2009/0310408 A1 | 12/2009 | Lee et al. |
| 2012/0224425 A1 | 9/2012 | Fai et al. |
| 2013/0346812 A1* | 12/2013 | Bahirat ............... G11C 16/349 714/704 |
| 2014/0050026 A1 | 2/2014 | Li |
| 2014/0086279 A1 | 3/2014 | Cao et al. |
| 2014/0101519 A1 | 4/2014 | Lee et al. |
| 2014/0347936 A1* | 11/2014 | Ghaly .................... G11C 11/56 365/185.18 |
| 2015/0117107 A1 | 4/2015 | Sun et al. |
| 2015/0310938 A1 | 10/2015 | Kim et al. |

\* cited by examiner

TEMPERATURE RELATED ERROR MANAGEMENT

PRIORITY INFORMATION

This application is a Continuation of U.S. application Ser. No. 14/644,365, filed Mar. 11, 2015, which claims priority to U.S. Provisional Application Ser. No. 62/068,267, filed Oct. 24, 2014, the specification of which is incorporated herein by reference.

TECHNICAL FIELD

The present disclosure relates generally to semiconductor memory devices and methods and, more particularly, to apparatuses and methods for temperature related error management.

BACKGROUND

Memory devices are typically provided as internal, semiconductor, integrated circuits and/or external removable devices in computers or other electronic devices. There are many different types of memory including random-access memory (RAM), read only memory (ROM), dynamic random access memory (DRAM), synchronous dynamic random access memory (SDRAM), phase change random access memory (PCRAM), and/or flash memory, among others.

Flash memory devices can be utilized as non-volatile memory for a wide range of electronic applications. Flash memory devices typically use a one-transistor memory cell that allows for high memory densities, high reliability, and/or low power consumption. Uses for flash memory include memory for solid state drives (SSDs), automotive applications, aeronautic applications, surveillance applications, personal computers, personal digital assistants (PDAs), digital cameras, cellular telephones, portable music players, e.g., MP3 players, and/or movie players, among other electronic devices.

Two common types of flash memory array architectures are the "NAND" and "NOR" architectures, so called for the logical form in which the basic memory cell configuration of each is arranged. A NAND array architecture arranges its array of memory cells in a matrix such that the control gates of each memory cell in a "row" of the array are coupled to, and in some cases from, an access line, which is commonly referred to in the art as a "word line". However, each memory cell is not directly coupled to a sense line (which is commonly referred to as a "data line" or a "bit line" in the art) by its drain. Instead, the memory cells of the array are coupled together in series, source to drain, between a common source and a sense line, where the memory cells commonly coupled to a particular sense line are commonly referred to as a "column" or a "string" in the art.

Memory cells in a NAND array architecture can be programmed to a targeted, e.g., desired, program state. For example, electric charge can be placed on or removed from a charge storage structure, e.g., a floating gate or charge trap, of a memory cell to put the memory cell into one of a number of program states. For example, a single level cell (SLC) can be programmed to one of two program states, e.g., one bit, so as to represent a binary data value, e.g., "1" or "0", stored by the memory cell.

Some NAND memory cells can be programmed to a targeted one of more than two program states. Such memory cells may be referred to as multistate memory cells, multi-unit cells, or multilevel cells (MLCs). MLCs can provide higher density memories without increasing the number of memory cells because each memory cell can represent more than one bit. A MLC using four program states (e.g., 11, 01, 00, and 10) can use four charge amounts in a floating gate so that the state can be represented by one of four voltage levels such that the MLC can store two bits of data. Generally, N bits per memory cell can be represented using $2^N$ voltage levels. Newer devices may be expected to use eight or more voltage levels. Using a high number of bits per memory cell allows the production of flash devices with high data density and thus reduces the overall cost per flash device. The read operation of a SLC uses one voltage threshold (Vt) level that is between the "0" and "1" voltage levels, e.g., program states. However, the read operation of a MLC with four states uses three Vt levels, an MLC with eight states uses seven Vt levels, and a memory cell that stores N bits per memory cell, represented by $2^N$ states, uses $2^{N-1}$ Vt levels for read operations.

A NAND array architecture that includes a large number of memory cells with multiple bits per memory cell can be expected to have a range of actual Vt levels for each program state based upon statistical variation. The range of actual Vt levels for each program state may result from random variation in manufacturing and/or programming of the memory cells, in erasing a memory cell prior to being reprogrammed, which can inherently broaden a voltage level range stored by each memory cell for each program state, a temperature difference at a time of programming, e.g., writing, versus a time of reading the memory cell, among other causes. With continued increase in complexity, miniaturization, etc., of NAND technology, along with the number of bits programmed per memory cell, the reliability and/or endurance of NAND memory cells may be decreasing, at least partially by variability in the actual Vts for the program states relative to preprogrammed reference, e.g., sense and/or read, voltages.

DETAILED DESCRIPTION

Figure 1:
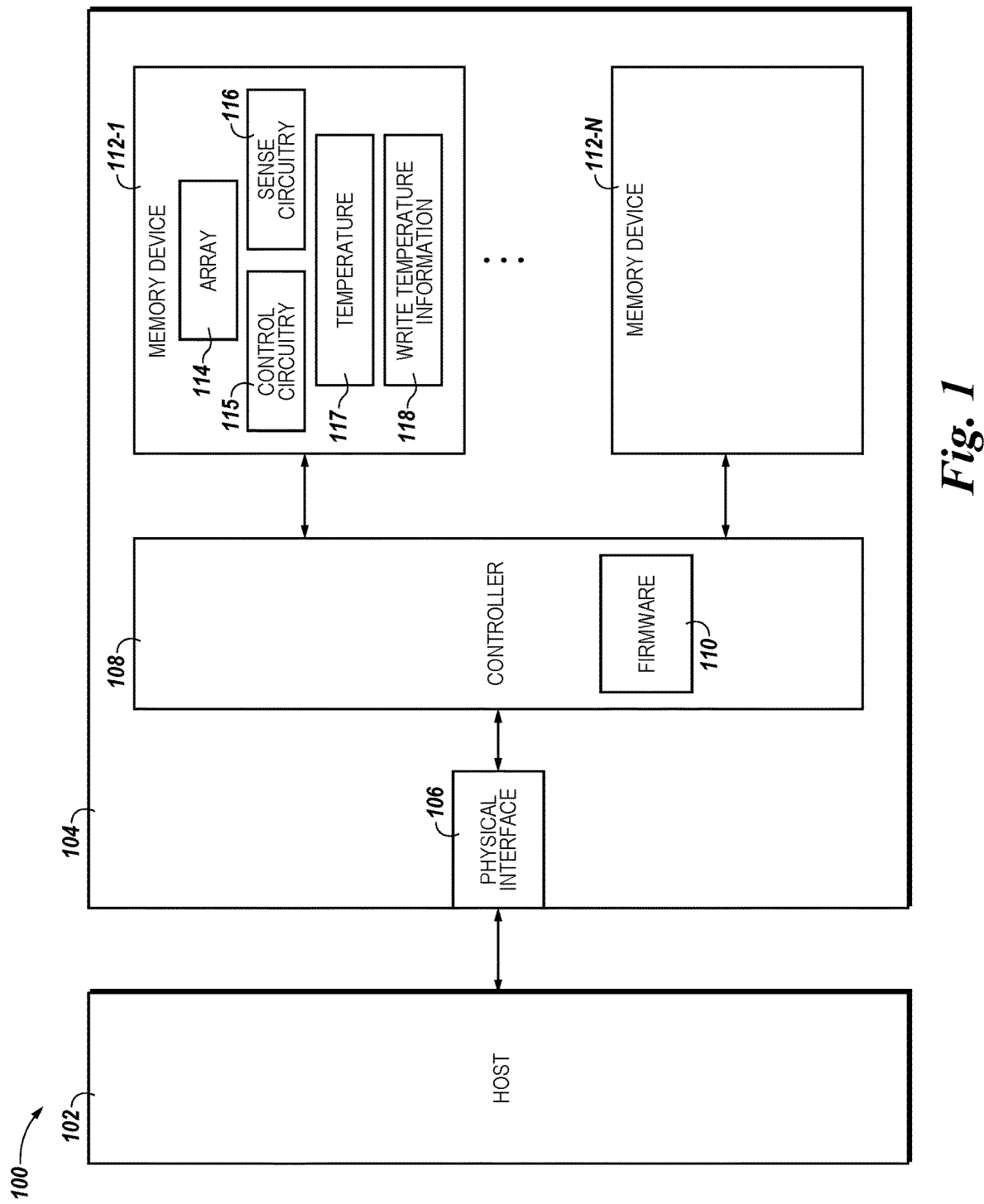
FIG. 1 is a functional block diagram of an apparatus in the form of a computing system including at least one memory system in accordance with one or more embodiments of the present disclosure.

The present disclosure includes apparatuses and methods for temperature related error management for memory cells. One or more apparatuses for temperature related error management can include an array of memory cells and a write temperature indicator appended to at least one predetermined number of bytes of the stored data in the array of memory cells. The apparatuses can include a controller configured to determine a numerical temperature difference between the write temperature indicator and a read temperature indicator and determine, from stored operations, an error management operation for the stored data based, at least in part, on comparison of the numerical temperature difference to a temperature difference threshold.

Solid state drives (SSDs) for some applications, e.g., automotive, aeronautic, surveillance, etc., have a wide operating temperature range relative to other applications, e.g., SSDs in business and domestic environments. NAND devices can demonstrate elevated raw bit error rates (RBERs) when, for example, data is written into memory cells of an array that is at a markedly different temperature than the temperature of the memory cells of the array when the data is read, e.g., being at least 20 degrees Celsius (° C.) different. Detection of errors resulting from high variance in operating temperatures between the write and read of the data could trigger various error management operations.

Among the error management operations are retirement of memory cells, e.g., one or more blocks of memory cells, that demonstrate data retention errors and determination of whether the data needs to be refreshed and/or whether the NAND location can be reused. Refreshing the data to a new location increases the write amplification of the drive and retiring the NAND locations reduces the drive size. Reduction of occurrence of such error management operations is desirable because they use up drive over-provisioning, result in increased write amplification and/or result in the drive entering a write protect mode, among other outcomes to be avoided where possible.

To reduce the occurrence of such undesirable outcomes, the present disclosure describes a number of embodiments of apparatuses and methods for temperature related error management. For example, the present disclosure describes to determine an ambient temperature of a drive, e.g., corresponding to an average temperature of memory cells therein, and to store a coded indicator of the temperature in auxiliary information that is written in addition to the data intended by the host to be stored in the memory cells. As described further herein, the write temperature indicator can be used, e.g., by a controller, to determine instances of data error detection that are temperature related, e.g., in contrast to inherent memory cell and/or drive defects. With this information, as described herein, undesirable block retirement and/or data refresh can be reduced.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, the designators "N" and "M," particularly with respect to reference numerals in the drawings, indicate that a number of the particular feature so designated can be included with one or more embodiments of the present disclosure. Additionally, as used herein, "a number of" something can refer to one or more such things. For example, a number of memory devices can refer to one or more memory devices.

The figures herein follow a numbering convention in which the first digit corresponds to the drawing figure number and the remaining digits identify an element or component in the drawing. Similar elements or components between different figures may be identified by the use of similar digits. For example, 111 may reference element "11" in FIG. 1, and a similar element may be referenced as 211 in FIG. 2. As will be appreciated, elements shown in the various embodiments herein can be added, exchanged, and/or eliminated so as to provide a number of additional embodiments of the present disclosure. In addition, as will be appreciated, the proportion and/or the relative scale of the elements provided in the figures are intended to illustrate the embodiments of the present invention and should not be taken in a limiting sense.

FIG. 1 is a functional block diagram of an apparatus in the form of a computing system 100 including at least one memory system 104 in accordance with one or more embodiments of the present disclosure. Memory system 104 can be, for example, an SSD. In the embodiment illustrated in FIG. 1, memory system 104 includes a physical host interface 106, a number of memory devices 112-1, . . . , 112-N (e.g., solid state memory devices), and a controller 108 (e.g., an SSD controller) coupled to the physical host interface 106 and memory devices 112-1, . . . , 112-N.

Physical host interface 106 can be used to communicate information between memory system 104 and another device, such as a host 102. Host 102 can include a memory access device (e.g., a processor). One of ordinary skill in the art will appreciate that "a processor" can be a number of processors, such as a parallel processing system, a number of coprocessors, etc. Example hosts can include and/or by implemented in automotive, aeronautic, surveillance, etc., applications, laptop computers, personal computers, digital cameras, digital recording and playback devices, mobile telephones, PDAs, memory card readers, interface hubs, and the like, that can experience temperature variability during use.

Physical host interface 106 can be in the form of a standardized physical interface. For example, when memory system 104 is used for information storage in computing system 100, physical host interface 106 can be a serial advanced technology attachment (SATA) physical interface, a peripheral component interconnect express (PCIe) physical interface, or a universal serial bus (USB) physical interface, among other physical connectors and/or interfaces. In general, however, physical host interface 106 can provide an interface for passing control, address, information (e.g., data), and/or other signals between memory system 104 and a host (e.g., host 102) having compatible receptors for physical host interface 106.

Controller 108 can include, for example, control circuitry and/or firmware 110. Controller 108 can be operably coupled to or included on the same physical device (e.g., a die) as one or more of the memory devices 112-1, . . . , 112-N. For example, controller 108 can be an application specific integrated circuit (ASIC) operably coupled to a printed circuit board including physical host interface 106 and memory devices 112-1, . . . , 112-N. Alternatively, controller 108 can be included on a separate physical device that is communicatively coupled to the physical device (e.g., the die) that includes one or more of the memory devices 112-1, . . . , 112-N.

Controller 108 can communicate with memory devices 112-1, . . . , 112-N to direct operations to sense (e.g., read), program (e.g., write), and/or erase information, among other functions and/or operations for temperature related error management for memory cells, as described herein. Controller 108 can have circuitry that may be a number of integrated circuits and/or discrete components. In a number of embodiments, the circuitry in controller 108 may include control circuitry for controlling access across memory devices 112-1, . . . , 112-N and/or circuitry for providing a translation layer between host 102 and memory system 104. The controller 108 can include firmware 110 circuitry and/or programming for analysis and/or implementation of, for instance, the temperature related error management for memory cells, as described herein. In one or more embodiments, such analysis can be performed as a result of input through the host 102 provided by a manufacturer- and/or seller-associated tester and/or an in-service tester, e.g., provided by an automated testing program and/or by a human operator, among other possibilities. As such, the controller 108 and/or the firmware 110 that is associated therewith, e.g., is a component of the controller, can be configured with coded instructions stored on a non-transitory medium and executable by a processor and/or as an ASIC with logic to direct and/or perform a number of functions and operations for temperature related error management, as described herein.

Memory devices 112-1, . . . , 112-N can include, for example, a number of non-volatile memory arrays 114, e.g., arrays of non-volatile memory cells. For instance, memory devices 112-1, . . . , 112-N can include arrays of memory cells, such as array 220 described with regard to FIG. 2, which can be operated in accordance with embodiments described herein. As will be appreciated, the memory cells in the memory arrays 114 of memory devices 112-1, . . . , 112-N can be in a NAND architecture, a NOR architecture, or some other memory array architecture.

As described herein, one or more memory devices 112-1, . . . , 112-N can be formed on the same die. A particular memory device, e.g., memory device 112-1, can include one or more arrays of memory cells 114 formed on the die. In one or more embodiments, as described further herein, the same die can include control circuitry 115, sense circuitry 116, a temperature 117 component, e.g., a digital thermometer device to output digital temperature information, to sense, e.g., measure, ambient temperature associated with a particular array of memory cells 114 formed on the die or portions thereof, such as a block, and/or a write temperature information device 118 to enable storage of a write temperature indicator coded to indicate an ambient temperature range in a timeframe in which stored data is written, as described herein. In various embodiments, a temperature range for the temperature 117 measurement can be defined as equal to a capability for ambient temperature measurement associated with the drive and/or can be defined by a typical SSD operating range, among other possible temperature ranges. The write temperature can be sampled at various increments, e.g., intervals, for example, as determined by how quickly the ambient temperature can markedly vary, e.g., once every 1 minute, among other possible increments.

The memory arrays 114 of memory devices 112-1, . . . , 112-N can include a number of memory cells that can be grouped. As used herein, a group can include a number of memory cells, such as those formed on or in a die, a number of entire arrays, a page, a block, a plane, and/or other groups of memory cells. For example, some memory arrays can include a number of pages of memory cells that make up a block of memory cells. A number of blocks can be included in a plane of memory cells. A number of planes of memory cells can be included on a die. As an example, a 128 gigabyte (GB) memory device can include 4320 bytes of information per page, 256 pages per block, 2048 blocks per plane, and 16 planes per memory device.

The embodiment illustrated in FIG. 1 can include additional circuitry that is not illustrated so as not to obscure embodiments of the present disclosure. For example, memory devices 112-1, . . . , 112-N can include address circuitry to latch address signals provided over I/O connectors through I/O circuitry. Address signals can be received and decoded by a row decoder and a column decoder, to access memory array 114. It will be appreciated that the number of address input connectors can depend on the density and/or architecture of memory devices 112-1, . . . , 112-N and/or memory arrays 114.

Figure 2:
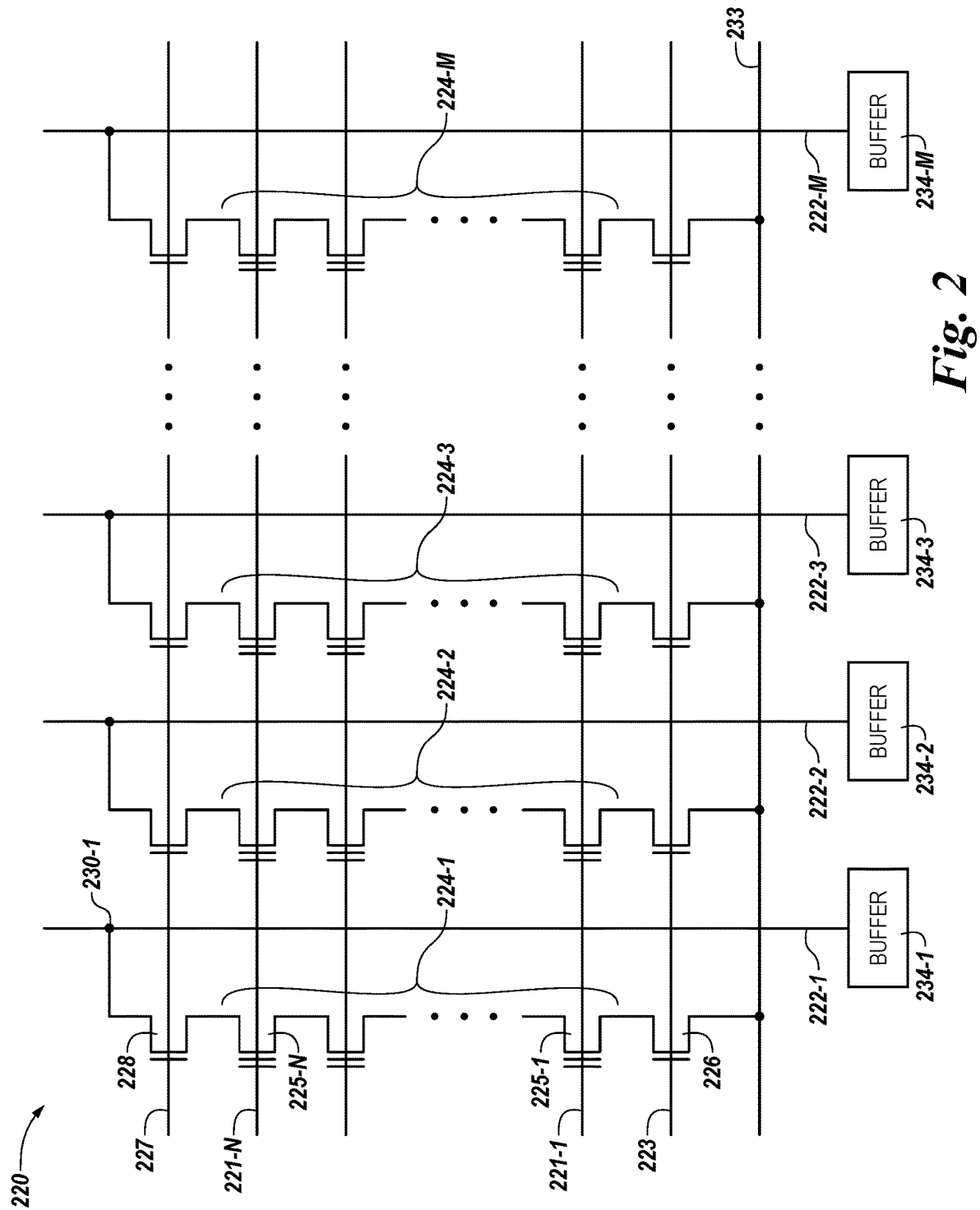
FIG. 2 is a schematic of a portion of an apparatus in the form of a non-volatile memory array in accordance with one or more embodiments of the present disclosure.

FIG. 2 is a schematic of a portion of an apparatus in the form of a non-volatile memory array 220 in accordance with one or more embodiments of the present disclosure. The embodiment of FIG. 2 illustrates a NAND architecture non-volatile memory array. However, embodiments of memory arrays and/or memory cells described herein are not limited to this example. As shown in FIG. 2, the non-volatile memory array 220 includes access lines, e.g., word lines 221-1, . . . , 221-N, and intersecting sense lines, e.g., local bit lines 222-1, . . . , 222-M. For ease of addressing in the digital environment, the number of word lines 221-1, . . . , 221-N and the number of local bit lines 222-1, . . . , 222-M can be some power of two, e.g., 256 word lines by 4,096 bit lines.

Memory array 220 includes NAND strings 224-1, . . . , 224-M. Each NAND string includes non-volatile memory cells 225-1, . . . , 225-N, each communicatively coupled to a respective access line, e.g., selected from word lines 221-1, . . . , 221-N. Each NAND string, and its constituent memory cells, is also associated with a respective sense line, e.g., selected from local bit lines 222-1, . . . , 222-M. The memory cells 225-1, . . . , 225-N of each NAND string 224-1, . . . , 224-M are connected in series source to drain between a source select gate (SGS), e.g., a field-effect transistor (FET) 226, and a drain select gate (SGD), e.g., FET 228. Each source select gate 226 is configured to selectively couple a respective NAND string to a common source 233 responsive to a signal on source select line 223, while each drain select gate 228 is configured to selectively couple a respective NAND string to a respective bit line responsive to a signal on drain select line 227.

As shown in the embodiment illustrated in FIG. 2, a source of source select gate 226 is connected to a common source line 233. The drain of source select gate 226 is connected to the source of the memory cell 225-1 of the corresponding NAND string 224-1. The drain of drain select gate 228 is connected to bit line 222-1 of the corresponding NAND string 224-1 at drain contact 230-1. The source of drain select gate 228 is connected to the drain of the last memory cell 225-N, e.g., a floating-gate transistor, of the corresponding NAND string 224-1.

In one or more embodiments, construction of the non-volatile memory cells 225-1, . . . , 225-N includes a source, a drain, a floating gate or other charge storage structure, and a control gate. The memory cells 225-1, . . . , 225-N have their control gates coupled to a word line, 221-1, . . . , 221-N, respectively. A NOR array architecture would be similarly laid out, except that the string of memory cells would be coupled in parallel between the select gates.

Subsets of memory cells, e.g., selected from those including 225-1, . . . , 225-N, coupled to a selected word line, selected from 221-1, . . . , 221-N, respectively, can be programmed and/or sensed, e.g., read, together as a group. A number of memory cells programmed and/or sensed together can correspond to a page of data. A programming operation, e.g., a write operation, can include applying a number of program pulses, e.g., 16V-20V, to a selected word line in order to increase the Vt of selected memory cells coupled to that selected word line to a desired program voltage level corresponding to a targeted program state.

A sensing operation, such as a read and/or a Vt analysis operation, e.g., using a soft data strobe, can include sensing a voltage and/or current change, e.g., discharge, on a sense line, e.g., a bit line, coupled to a selected memory cell in order to determine the program state and/or the Vt of the selected memory cell. The sensing operation can include precharging a bit line and sensing the discharge when a selected memory cell begins to conduct.

Sensing to determine the program state and/or the Vt of the selected memory cell can include providing a number of sensing voltages, e.g., read voltages, to a selected word line while providing a number of voltages, e.g., read pass voltages, to the word lines coupled to the unselected memory cells of the string sufficient to place the unselected memory cells in a conducting state independent of the Vt of the unselected memory cells. The bit line corresponding to the selected memory cell being read and/or verified can be sensed to determine whether or not the selected memory cell conducts in response to the particular sensing voltage applied to the selected word line.

For example, the program state of a selected memory cell can be determined by the word line voltage at which the bit line current reaches a particular reference current associated with a particular program state. In contrast, to determine the Vt of a selected memory cell, e.g., memory cell 225-1, the corresponding word line, e.g., word line 221-1, can have a range of sensing voltages applied so that the word line is stepped, e.g., in small voltage difference increments, from a low voltage, e.g., 0 volts (V) to a relatively high voltage, e.g., 6 V. For example, the range of 0-6 V can be covered in 120 steps that each increases by 50 millivolts (mV). The voltage at which the sense output at the corresponding bit line, e.g., bit line 222-1, changes from "0" to "1", e.g., discharges, corresponds to the Vt of the selected memory cell.

It can be useful, in particular for a selected memory cell and/or a page, block, etc., of memory cells, to compare a determined Vt for each memory cell, a distribution of Vts for the plurality of memory cells, and/or program states thereof to an intended program state for that memory cell and/or page, block, etc., of memory cells. As such, a number of buffers 234-1, . . . , 234-M each can be coupled to a respective local bit line 222-1, . . . , 222-M that serves as a sense line. Each buffer can include instructions and/or memory, e.g., stored on the die in a memory device, to enable Vt and/or program state analysis and/or to facilitate execution of error determination during a write and/or read operation, as described herein.

An example of the sense circuitry 116 illustrated in FIG. 1 is described further below in association with the buffers shown in FIG. 2 at 234-1, . . . , 234-M. For instance, in a number of embodiments, the buffer 234 can include a sense amplifier (sense amp) (not shown) and a number of other components, which can be used to perform logical operations on the die, e.g., on data associated with a corresponding sense line, that is, a local bit line. As such, data storage, collection, update, exchange, and/or comparison functions can be performed by executing instructions stored in the buffer 234 rather than and/or in addition to being performed by processing resources external to the buffer 234, e.g., by a number of processors associated with the controller 108, the host 102, and/or other processing circuitry located elsewhere.

The sense amp in the buffer 234 can be coupled to at least one corresponding local bit line corresponding to a particular column of memory cells. The sense amp can be operated to determine a program state, e.g., a logic data value, stored in a selected memory cell. Embodiments are not limited to a given sense amp architecture or type. For instance, sense circuitry 116 in accordance with a number of embodiments described herein can include current-mode sense amps and/or single-ended sense amps, e.g., sense amps coupled to one sense line, among others. As described herein, a sense amp can amplify a signal associated with conduction caused by discharge of a selected memory cell, e.g., sensing a voltage and/or current change on a bit line coupled to a selected memory cell in order to determine the program state and/or the Vt of a number of selected memory cells by sensing when the selected memory cells begin to conduct. In one or more embodiments, the sense amp also can be used as an amplifier to sense conduction of selected memory cells during a standard read operation.

The buffer 234 can include a number of latches (not shown). The latches can operate in association with, for example, address circuitry to latch address signals provided over an I/O bus, e.g., a data bus, through I/O circuitry. Address signals can be received and decoded by, for example, a row decoder and a column decoder to access an array of memory cells, e.g., as shown at 114 in FIG. 1 and/or at 220 in FIG. 2. Data can be read from the array by sensing voltage and/or current changes on the sense lines using the sense circuitry 116, e.g., including the sense amp. The sense circuitry 116 can read and latch a page, e.g., a row, of data from the array in a particular latch.

Figure 3:
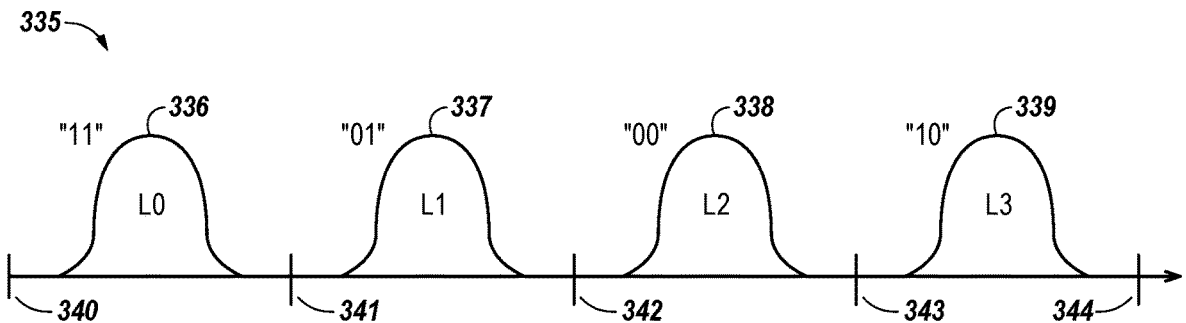
FIG. 3 is a diagram illustrating a number of Vt distributions corresponding to program states associated with programmed memory cells in accordance with one or more embodiments of the present disclosure.

FIG. 3 is a diagram 335 illustrating a number of Vt distributions corresponding to program states associated with programmed memory cells in accordance with one or more embodiments of the present disclosure. To find the Vt of a particular memory cell, the word line can be stepped from a lower, e.g., lowermost, voltage to a higher, e.g., uppermost, voltage, sensing the memory cell at every step. The point at which the sense output changes, e.g., from a "1" to a "0", is the Vt of that memory cell. To analyze Vts, it can be useful to compare the sensed Vts of a number of memory cells throughout a range of sensing voltages to the particular program state in which each of the memory cells was intended to be, e.g., 11, 01, 00, and 10 in the case of the four-state MLC illustrated in FIG. 3. The memory cells associated with FIG. 3 can be memory cells such as memory cells 225-1, . . . , 225-N described herein with regard to FIG. 2. The memory cells associated with FIG. 3 are two-bit, e.g., four-state, MLCs. However, embodiments of the present disclosure are not limited to this example.

In a sensing operation performed on a selected memory cell in a NAND string, the unselected memory cells of the string are biased so as to be in a conducting state. In such a sensing operation, the program state of the selected memory cell can be determined based on the current and/or voltage sensed on the bit line corresponding to the string in response to a particular sensing voltage applied to the corresponding word line that matches or exceeds the Vt for the selected memory cell. For instance, the program state of the selected memory cell can be determined based on whether the bit line current changes by a particular amount or reaches a particular level in a given time period.

The Vt distributions 336, 337, 338, and 339 of FIG. 3 correspond to a number of memory cells each programmed to one of four program states, e.g., e.g., 11, 01, 00, and 10 corresponding to L0, L1, L2, and L3. In one or more embodiments, the different program states of L0 and L1 can, for example, be combined to be considered as a lower level and the different program states of L2 and L3 can be combined to be considered as an upper level. Alternatively, each of L0, L1, L2, and L3 can be considered as a separate level for Vt analysis.

As shown in FIG. 3, Vt distribution 336 corresponds to a number of memory cells that are programmed to a first program state, e.g., L0. In at least some embodiments, programming a memory cell to the first program state may simply include allowing a memory cell to remain in an erased state. That is, the first program state may actually be the erased state for both the upper page and the lower page. Vt distribution 337 can correspond to a number of memory cells that are programmed from an erased state, which could be the same as the first program state L0, to a second program state, e.g., L1. A first preprogrammed read reference voltage 341, e.g., which can be higher than a ground state voltage 340, can be applied thereto through the corresponding word line in an attempt to verify, e.g., sense or read, that the program state of the selected memory cell does not remain at L0, e.g., is at least at L1.

However, Vt tails can, for example, extend from the upper end of the L0 distribution shown at 336 and the lower end of the distribution shown at 337, e.g., due to broadening of a voltage level range stored by at least some memory cells for each program state and/or a center of one or more such distributions can be shifted to the left resulting from being written at an elevated ambient temperature, e.g., at an upper end of a measured temperature range and/or markedly higher than an ambient read temperature, or shifted to the right resulting from being written at a lowered ambient temperature. Such a marked difference between the write temperature and the read temperature can affect the Vts of the memory cells relative to a programmed read reference voltage, e.g., as shown at 341, intended to read the memory cells, e.g., at an ambient temperature between these temperatures. Moreover, the actual voltage of an applied read reference voltage may vary based upon a marked temperature difference between the temperature at which the read reference voltage was programmed and the temperature of the circuitry to which the read reference voltage is applied. For example, a read reference voltage programmed for use at an intermediate temperature may actually result in application of a higher voltage or a lower voltage when used with word lines, memory cells, and other circuitry at markedly higher or lower temperatures. As such, the Vt distributions of memory cells read at markedly elevated or lowered ambient temperatures may result in read errors when using a read reference voltage not programmed for sensing in such a temperature range.

Figure 4:
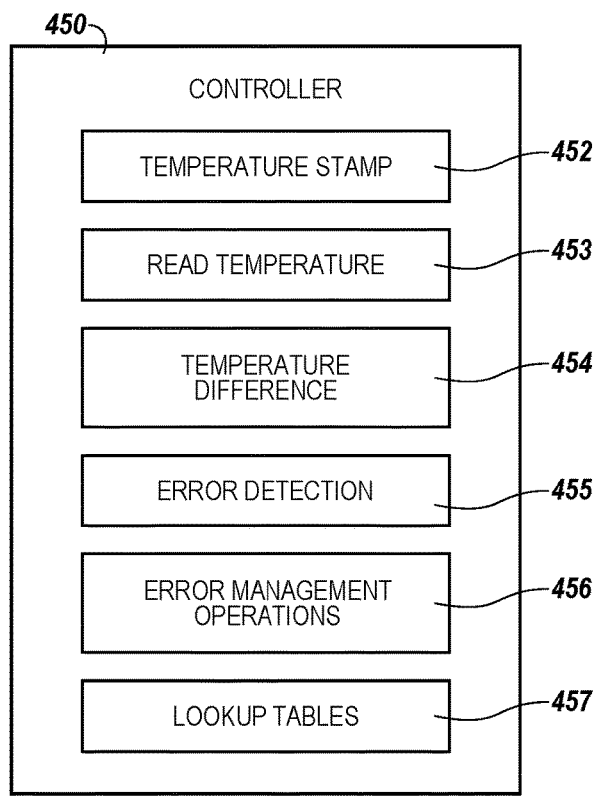
FIG. 4 is a functional block diagram of controller elements associated with temperature related error management in accordance with one or more embodiments of the present disclosure.

FIG. 4 is a functional block diagram of controller 450 elements, e.g., functions and/or operations, associated with temperature related error management in accordance with one or more embodiments of the present disclosure. In memory devices, e.g., in NAND flash based systems, error management is a key to ensuring data integrity. The key to sustained data integrity is not only the development of data recovery techniques (such as redundant array of independent NAND (RAIN), retry, and/or NAND special mode read, among other data recovery techniques), but also effective NAND memory cell, e.g., individual memory cells, pages, blocks, etc., retirement and data folding policies. For example, an objective of a block retirement policy can be to identify the blocks resulting in uncorrectable errors, determine whether the uncorrectable errors are expected based on the drive usage conditions, determine the mechanism resulting in the errors, and/or prevent the blocks from further use if an inherent problem with the NAND structure and/or memory cells is detected. It is thus desirable to reduce error handling trigger rates, potentially resulting in loss of memory capacity by retirement of the memory blocks, and also reduce a potential of data loss beyond the capabilities of the data recovery techniques.

Although NAND is non-volatile, data stored in NAND memory cells is capable of being lost or misread either through the course of time or under particular conditions, including marked differences between write and read temperatures, as described herein. A rate of bits on a NAND device providing erroneous information as a result of a write and/or read operation may vary, for example, from about one out of a thousand bits to about one out of a million bits. Hence, for example, the data can be protected by an error correction code (ECC) parity check technique for error detection before writing the user data to the NAND memory. In some embodiments, ECC parity check code, e.g., data, can also be stored on NAND memory cells along with the user data. When there is a host 102 request to read the data from the memory devices 112-1, . . . , 112-N, the controller 108 and/or the firmware 110 can read the data from the selected NAND memory cells and an error correction unit (ECU) can decode the user data and the ECC parity check data to correct the erroneously read bits before returning the corrected data to the host. In various embodiments, by way of example and not by way of limitation, the ECU can be integrated with a number of the buffers 234 shown in FIG. 2 and or the error detection 455 function of the controller 450 shown in FIG. 4.

There can be a limitation on the number of ECC parity check data bytes being stored because these are subtracted from a NAND memory budget. Hence, the ECU may only support correction of a limited number of erroneous bits. In some embodiments, it can be the responsibility of the controller 450 and/or the firmware 110 to rewrite the corrected data to a different, e.g., newer, location so that the number and/or rate of erroneous bits is restored to a lesser value, e.g., approximately the value of erroneous bits resulting from the original write operation. For example, data that has been programmed to NAND memory cells several months previously may undergo data retention issues and/or may have higher erroneous bit counts.

By moving the corrected data to a newer location, the age of the data can be reset, e.g., to zero, and the erroneous bit count related to retention time can be reduced, thereby reducing the overall erroneous bit count of the system. There are several other mechanisms related to erroneous writes and/or reads of data stored on NAND memory cells that, for example, can be associated with age of the data and frequency with which data is accessed before the data is deleted or overwritten, among other issues. In some embodiments, the firmware, as shown at 110 in FIG. 1 and/or the error detection 455 function of the controller 450 shown in FIG. 4, can be responsible for determining a raw bit error rate (RBER=number of erroneous bits per total number of bits written) and copying the data to a newer location in an effort to reduce the RBER within the ECU correction capability. Copying the data to a newer location is called refreshing the data.

Refreshing the data, e.g., folding, can be performed due to NAND Vt sensitivity to read disturb and/or charge loss. For example, to counteract charge loss, refreshing can be done at regular intervals. However, on systems without a time stamp, tracking the RBER per each predetermined number of memory cells, e.g., codeword, either in real time or as part of background tasks and refreshing the data based on a predetermined erroneous bit threshold is another operation. Unnecessary refreshing is undesirable because refreshing affects the performance and/or endurance of the drive. In various embodiments, memory cell retirement and/or data folding can be dependent on determination of the RBER.

As described herein, a codeword is indicative of the granularity at which the ECU generates the ECC parity data. For example, the host 102 can send four kilobytes (KB) of data to be written, but the ECU can split the data into two data portions (codewords) of two KB and can generate the ECC parity check code for each two KB codeword before the data is written for storage in the NAND memory cells. In some embodiments, the firmware, as shown at 110 in FIG. 1 and/or the error detection 455 function of the controller 450 shown in FIG. 4, can track the RBER of each codeword written to the NAND, e.g., by periodically or continuously scanning predetermined portions or the entirety of the NAND memory space. In various embodiments, as described herein, when the controller 450, e.g., an error detection 455 function thereof, detects recurrent temperature related events, the controller 450 can direct scanning of the auxiliary data of a representative number, or all, codewords on the drive in order to contribute to a creation and/or rewrite of a number of lookup tables 457, as described herein, that include the write temperature of each of these codewords as one determinant of error management operations, as described herein.

Tracking the RBER while the host is writing and/or reading the data to the drive may result in loss of performance because the hardware resources of the system may be shared between host requests and the error detection scanning. To resolve this, error detection tasks, e.g., tracking the RBER, may be invoked by the controller 450 when write and/or read tasks requested by the host are not being executed on the portion of the NAND memory space to be scanned.

As described herein, the Vt of NAND memory cells may fluctuate with temperature. Different memory cells, e.g., on a page or a block, may experience different Vt shifts at a particular temperature, thereby resulting in Vt distribution widening. Alternatively and/or in addition, the Vt may increase at lower ambient temperatures and Vt may decrease at higher ambient temperatures. NAND devices may have in-built temperature compensation circuitry that adjusts, e.g., via default trims, a read reference voltage based on the ambient temperature. However, adjustment of the read reference voltages as such and Vt shifts of the memory cells may not be closely correlated, with the shrinking and expanding read windows at varying temperatures resulting in unacceptable write and/or read errors.

In contrast, as described herein, read reference voltage positive or negative offsets can be preemptively applied in real time, e.g., based upon values stored in lookup tables 457, to the default trims, for example, before performing a read operation on the NAND memory cells. This approach can reduce the temperature related retirement and/or refresh trigger rates.

For instance, ECC is error correction code and CECC represents data and/or a codeword that is ECU correctible. In contrast, UECC is an uncorrectable ECC event. CECC and UECC events are typically defined based on a default read reference voltage. An UECC event can be correctible with read level calibration (RLC), as described herein. A number of CECC events can be significant to the controller 108, 450 and/or the firmware 110 determining how many erroneous bits are in the codeword and whether the erroneous bits are converging toward an upper ECU correction capability. The controller 108, 450 and/or the firmware 110 can be configured to refresh the data, as described herein, when the ECU corrected bits exceed a certain threshold.

Data on a NAND memory device is stored in order to be read at a particular Vt of a memory cell. For instance, a 0 can be stored above a Vt of the memory cell and 1 can be stored below the Vt of the memory cell or vice-versa. The memory cell conducts depending on the read reference voltage applied to the memory cell. However, the Vt of the memory cell is subject to changes, for example, time since the memory cell has been programmed, number of times the memory cell has been repeatedly read, ambient temperature to which the memory cell is exposed, among other usage conditions. As such, information read from the NAND memory cell can be corrupted based on the usage condition. One way to recover the correct information is by changing the read reference voltage. The read reference voltages can be repeatedly varied until the ECU determines that the correct information, e.g., data, is being read. When the data is correctible using this RLC, the event, or codeword, is called RLC recoverable.

In some circumstances, an undesirably high RBER and/or UECC may occur more notably than otherwise under high cross-temperature conditions, e.g., a write at an elevated ambient temperature and a read at a lower ambient temperature, or vice-versa. However, as the read temperature approaches the write temperature, the RBER and/or UECC may transition to a more normal range, e.g., a baseline associated with write and read temperatures that are close together. As such, the impact of high RBER and/or UECC may only be evident at write and read temperatures that are markedly different, e.g., being at least 20° C. different. In some circumstances, robustness of a NAND based system to temperature related issues, e.g., increased ECC parity check and/or RBER issues, among other possible error detection techniques, may depend on its read window budget margin for adjusting read windows, e.g., as part of RLC.

As described herein, marked ambient temperature differences between the write and read of the memory cell can increase the RBER by inducing a Vt shift, although possibly not degrading the structure and/or capability of the memory cell itself. For example, as the difference between the write temperature and the read temperature shrinks, the RBER can decrease. However, under the circumstances with marked ambient temperature differences, the increased RBER could trigger occurrence and/or detection of CECC and/or UECC events, which in turn could trigger either retirement or refreshing of memory cells, pages, blocks, etc. Such unnecessary block retirement, for example, can reduce the over-provisioning of the NAND system and/or affect the drive performance. That is, if a NAND drive is marketed as having a 128 GB memory capacity and the NAND memory space on the drive exactly meets the drive specification, there may not be NAND space available to store, for example, controller and/or firmware information, instructions, lookup tables, etc., for determination of temperature related error management operations, as described herein. Hence, the NAND memory space provided on the drive can exceed the data sheet drive capacity specification. The extra NAND memory space available on the drive is called over-provisioning. Such unnecessary block retirement also can, for example, potentially force particular blocks into a write protect mode if excessive blocks are retired. In addition, unnecessarily refreshing the data may negatively affect the performance of the drive, for example, by increasing the write amplification, which could result in using and reusing the NAND architecture beyond its specified endurance limits and possibly resulting in data loss.

Accordingly, an element of the temperature related error management described herein is to store an indicator of the ambient temperature, e.g., as determined as a result of measurement by the temperature 117 component shown in FIG. 1, in auxiliary data associated with the data requested to be stored by the host. In various embodiments, the ambient temperature can be stored as auxiliary data, e.g., by the write temperature information 118 component shown in FIG. 1, coding the write temperature as bits in a number of memory cells appended to the data stored in adjacent memory cells in a timeframe during which the data is written and/or stored as a temperature stamp 452 in the controller 450 shown in FIG. 4 and/or in the firmware 110 shown in FIG. 1.

In various embodiments, ECC parity data and/or auxiliary data can be appended to the user data before writing the user data to the NAND memory cells. In various examples, a particular proportion of, e.g., all, codewords written to the NAND memory cells can include appended auxiliary data, which, possibly in addition to other metadata, can include a coded write temperature indicator. Whenever a retirement and/or refresh event is detected, for example, by an error detection 455 element of the controller 450, the controller 450 can read the write temperature indicator in the auxiliary data and/or the corresponding write temperature stamp 452, compare it with an ambient read temperature 453, e.g., as determined by and/or received from the temperature 117 component shown in FIG. 1, determine, e.g., compute, a temperature difference 454, and determine whether the retirement and/or refresh event is a temperature related event or not, e.g., by reference to a number of lookup tables 457.

Because temperature related issues may be evident only at marked differences between the write and read temperatures, temperature ranges can, in some embodiments, be quantized in large steps. For example, with a quantized step size of 12° C., 3 available auxiliary bits can cover a temperature range of 96° C. ($2^3 \times 12°$ C.=96° C.). As described herein, subranges of the total temperature range can be coded with a variable number of bits that define the granularity of the subrange relative to the total temperature range. That is, for a 96° C. total temperature range, three bits ($2^3$ or 8 values) provide a coarse granularity where the temperature difference thresholds would be in subranges 12° C. apart, where five bits would provide a finer granularity to the subranges.

In various embodiments, RBER change profiles can be predetermined for elevated write temperature/lower read temperature and/or lower write temperature/elevated read temperature situations and/or temperature difference thresholds can be identified for both situations, e.g., for storage in the lookup tables 457. Such profiles and/or thresholds can be utilized for selection from a number of predetermined error management operations 456.

For example, blocks of memory cells meeting criteria of a retirement policy and/or a refresh policy, e.g., based upon matching or exceeding ECC parity check and/or RBER levels stored in the error detection 455 element, but not meeting, e.g., not matching or exceeding, a temperature difference profile and/or threshold stored in the lookup tables 457 may be immediately retired and/or refreshed based on meeting the criteria of those predetermined error management operations 456. In contrast, blocks of memory cells meeting both the retirement and/or refresh policy and meeting a temperature difference profile and/or threshold stored in the lookup tables 457 may be spared from retirement and/or refresh and/or may be added to a sensitive blocks queue based on meeting the criteria of those predetermined error management operations 456. In some embodiments, the blocks of memory cells added to the sensitive blocks queue can be retested by writing dummy data into memory cells of these blocks and measuring the RBER under conditions where the write and read temperatures are essentially the same in order to verify that the block of memory cells should not be retired.

Devices equipped with memory, e.g., in a NAND architecture, and a controller associated therewith may not have the ability to identify whether high ECC parity check and/or high RBER events result from and/or are aggravated by marked differences between write and read ambient temperatures. In contrast, embodiments of the methods and apparatuses described herein not only provide a controller 108, 450 and/or firmware 110 of devices equipped with memory, e.g., in a NAND architecture, with an ability to separate temperature related events from other memory cell defect mechanisms, but also provide an ability to execute preemptive action by changing the read reference voltages in real time in order reduce trigger rates for memory cell retirement and/or refresh. That is, if a drive is determined to operate under conditions where some of the memory cells may have markedly different write and read temperatures, a controller, for example, can create and/or modify a lookup table using a coded write temperature indicator stored in auxiliary data and use this information for preemptive corrective action to reduce high trigger rates for retirement and/or refresh based upon high levels of CECC, UECC, ECC parity check errors, and/or RBER, among other possibilities for error detection.

Accordingly, one or more methods for temperature related error management, as described herein, can include storing a write temperature indicator indicating, e.g., coded to indicate, an ambient temperature range in a timeframe in which the data is written as stored data, receiving, e.g., from the temperature component 117 shown in FIG. 1, a read temperature indicator indicating, e.g., coded to indicate, an ambient temperature range in a timeframe in which the stored data is, or is intended to be, read. The one or more methods can further include determining, e.g., computing, a numerical temperature difference between the write temperature indicator and the read temperature indicator, and determining, from stored operations, an error management operation for the stored data based, at least in part, on a comparison of the numerical temperature difference to a temperature difference threshold.

In one or more embodiments, the method can include, as described herein, comparing the numerical temperature difference to a number of predetermined temperature difference thresholds in a lookup table stored in non-volatile memory, e.g., as shown at 457 in FIG. 4. One or more embodiments of the method can include determining a number of errors, e.g., via one or more error detection techniques described herein or otherwise, in a read of the stored data to prompt an error management operation prior to receiving the read temperature indicator. For example, determining the number of errors can include performing an ECC parity check based upon comparison to parity data determined for at least one predetermined number of bytes, e.g., one or more codewords, of the data stored prior to writing the data for storage. As described herein, the method can include appending the write temperature indicator as auxiliary data to at least one predetermined number of bytes, e.g., one or more codewords, of the stored data. In some embodiments, the auxiliary data also can include the parity data.

In one or more embodiments, the method can include, as described herein, determining that a RBER for a read of stored data is at least equal to a stored threshold and determining, from the stored operations, an error management operation for the stored data based, at least in part, on whether the numerical temperature difference is at least equal to a temperature difference threshold, where the numerical temperature difference can be determined, e.g., calculated, as a difference between a stored indicator of an ambient temperature in a timeframe in which the stored data was written and a received, e.g., stored, indicator of an ambient temperature in a timeframe in which the stored data is, or is intended to be, read. In one or more embodiments, the method can include storing in at least one of a number of lookup tables, e.g., as shown at 457 in FIG. 4, a plurality of temperature difference thresholds associated with a number of RBERs to be expected, e.g., as determined empirically, for a read at each temperature difference threshold.

In one or more embodiments, the method can include at least one of the number of lookup tables storing a first profile for temperature difference thresholds associated with the number of RBERs for high temperature writes and lower temperature reads that is different from a second stored profile for low temperature writes and higher temperature reads. Among various stored error management operations, e.g., as shown at 456 in FIG. 4, the method can include implementing a first error management operation to retire a number of memory cells, e.g., a number of blocks, associated with storage of the stored data when the RBER is at least equal to a stored retirement threshold and the RBER exceeds an RBER expected at a particular temperature difference threshold corresponding to the ambient temperature, e.g., the difference between the write and read ambient temperatures. In contrast, the method can include implementing a second error management operation to not retire a number of memory cells, e.g., a number of blocks, associated with storage of the stored data when the RBER is at least equal to the stored retirement threshold and the RBER is less than or equal to an RBER expected at the particular temperature difference threshold corresponding to the ambient temperature.

In one or more embodiments, a consequence of not retiring the number of memory cells, as just stated, can include evaluating the number of memory cells, e.g., the number of blocks, associated with storage of the stored data by writing, in a particular ambient temperature range, new data for storage in the number of memory cells and reading, in the particular ambient temperature range, the stored new data to determine a new RBER and determining, when the new RBER is near a baseline RBER level, that the read errors that contributed to being at least equal to the stored retirement threshold are due to the numerical temperature difference, e.g., rather than other problems with the memory cells.

Additionally, among the various stored error management operations, e.g., as shown at 456 in FIG. 4, the method can include implementing a third error management operation to refresh, e.g., fold, a number of memory cells, e.g., a number of blocks, associated with storage of the stored data when an RBER for a read is at least equal to a stored refresh error threshold and the RBER exceeds an RBER expected at a stored temperature difference threshold corresponding to the ambient temperature, e.g., a difference between the read temperature and the write temperature. In contrast, the method can include implementing a fourth error management operation to not refresh data from a number of memory cells, a number of blocks, associated with storage of the stored data when the RBER is at least equal to the stored refresh threshold and the RBER is less than or equal to the RBER expected at a particular temperature difference threshold corresponding to the ambient temperature.

In one or more embodiments, the method can include determining, e.g., using the controller 450 shown in FIG. 4, particular memory cells, e.g., blocks of memory cells, to have auxiliary data with a write temperature indicator having a numerical difference from the ambient read temperature indicator, e.g., based upon the temperature difference 454 element in FIG. 4, that corresponds to a particular read reference voltage adjustment, e.g., based upon accessing such a profile in at least one of the number of lookup tables 457, in order to reduce the RBER to preempt determination of an error management operation. In various embodiments, the method can include updating, e.g., based upon empirical test results, read reference voltage adjustments in the at least one of the number of lookup tables 457 to improve the preemption of determination of an error management operation.

In one or more embodiments, the method can include, as described herein, storing the write temperature indicator indicating the ambient temperature range in the timeframe in which data is written as stored data, receiving the read temperature indicator indicating the ambient temperature range in a timeframe prior to reading the stored data. In one or more embodiments, the method can include receiving the write temperature indicator and the read temperature indicator by at least one of the controller 108, 450 and the firmware 110, determining, e.g., computing, by the at least one of the controller 108, 450 and the firmware 110, the numerical temperature difference between the write temperature indicator and the read temperature indicator, and determining, by the at least one of the controller 108, 450 and the firmware 110, an error management operation 456 for a subsequent read of the stored data based, at least in part, on the numerical temperature difference being at least equal to a temperature difference threshold.

In one or more embodiments, the method can include appending the write temperature indicator as auxiliary data to at least one predetermined number of bytes, e.g., at least one codeword, of the stored data. The method can include storing in at least one of the number of lookup tables 457 a plurality of temperature difference thresholds each associated with a read reference voltage, e.g., determined empirically, to be applied in order to reduce read errors associated with a temperature difference induced shift in a Vt for memory cells that store the data. In one or more embodiments, the method can include accessing the at least one of the number of lookup tables 457 and applying, by the at least one of the controller 108, 450 and the firmware 110, the read reference voltage to preemptively reduce the read errors associated with the temperature difference, where the applied read reference voltage differs from a read reference voltage suitable for a read at the temperature at which the stored data was written.

In one or more embodiments, an apparatus for temperature related error management can be configured to include an array of memory cells, e.g., as shown at 114 in FIG. 1 and/or 220 in FIG. 2. In one or more embodiments, the apparatus can be configured to include a write temperature indicator appended, e.g., as coded auxiliary data, as shown at 118 in FIG. 1, to at least one predetermined number of bytes, e.g., at least one codeword, of the stored data in the array of memory cells. In one or more embodiments, the apparatus can be configured to include a controller 450, e.g., as shown at 450 in FIG. 4 and/or firmware, e.g., as shown at 110 in FIG. 1, configured to determine, e.g., compute, a numerical temperature difference, as shown at 454 in FIG. 4, between the write temperature indicator and the read temperature indicator and determine, from stored operations, an error management operation, as shown at 456 in FIG. 4, for the stored data based, at least in part, on comparison of the numerical temperature difference to a temperature difference threshold.

In one or more embodiments, the apparatus can be further configured to include a component to receive an ambient temperature measurement, e.g., as shown at 118 in FIG. 1, to enable storage of the read temperature indicator in a timeframe associated with a read, or intended read, of the stored data. In one or more embodiments, the apparatus can be further configured to store in the controller and/or the firmware a write temperature stamp, e.g., as shown at 452 in FIG. 4, for the at least one predetermined number of bytes, e.g., codewords, of data, where the write temperature stamp can be coded to indicate at least one of an ambient temperature range in a timeframe in which the data is written for storage and/or documentation, e.g., a time and date, of the timeframe in which the data is written for storage. In one or more embodiments, the apparatus can be further configured to sample ambient temperature sequentially in predetermined time increments, e.g., intervals, with the temperature 117 component shown in FIG. 1, to enable storage of the write temperature indicator to indicate an ambient temperature range in a timeframe in which the stored data is written.

In one or more embodiments, the apparatus can be further configured to code subranges, as described herein, of a total temperature range for the write temperature indicator appended as auxiliary data to unused bits of the at least one predetermined number of bytes, e.g., codewords, of the stored data. In various embodiments, the apparatus can be further configured such that the total temperature range is determined as one of a temperature measurement capability of the apparatus and a solid state device, e.g., NAND flash device, operating range, among other possible total temperature ranges. For example, the subranges of the total temperature range can be coded with a variable number of bits that define the granularity of the subrange relative to the total temperature range.

In one or more embodiments, an apparatus for temperature related error management, as described herein, can be configured to include a first component to determine an RBER during a read of data stored in an array of memory cells, e.g., as shown at 234 in FIG. 2 and/or 455 in FIG. 4. In one or more embodiments, the apparatus can be configured to include a second component for receipt of an ambient temperature measurement, e.g., from the temperature measurement component shown at 117 in FIG. 1, in a timeframe associated with a read of the stored data, to enable storage of a coded read temperature indicator, and the apparatus can be configured to include a write temperature indicator appended as the coded auxiliary data to at least one predetermined number of bytes, e.g., at least one predetermined number of codewords, of the stored data, as shown at 118 in FIG. 1.

In one or more embodiments, the apparatus can include a controller, e.g., as shown at 450 in FIG. 4, and/or firmware, e.g., as shown at 110 in FIG. 1. The controller and/or firmware can be configured to determine, e.g., compute, a numerical temperature difference between the write temperature indicator and the read temperature indicator, e.g., as shown at 454 in FIG. 4, and determine, from stored operations, an error management operation, e.g. as shown at 456 in FIG. 4, for the stored data based, at least in part, on comparison of the determined RBER a number of stored error thresholds and comparison of the numerical temperature difference to a stored temperature difference threshold, e.g., as determined from accessing at least one of the number of lookup tables shown at 457 in FIG. 4. In one or more embodiments, the apparatus can be further configured to store in at least one lookup table a plurality of temperature difference thresholds associated with a number of RBERs to be expected, e.g., as determined empirically, for a read at each of a plurality of temperature difference thresholds. In one or more embodiments, the apparatus can be further configured to implement a selection between a plurality of at least the first, second, third, and fourth error management operations previously described with regard to the method embodiments.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
    an array of memory cells;
    a write temperature indicator appended to at least one predetermined number of bytes of stored data in the array of memory cells; and
    a controller comprising circuitry and configured to:
        determine an error rate during a read of data stored in the array of memory cells;
        determine a temperature difference between the write temperature indicator and a read temperature indicator; and
        retire a number of memory cells associated with storage of the stored data when the determined error rate is at least equal to a stored retirement error threshold and the determined error rate exceeds an error rate expected at a stored temperature difference threshold.

2. The apparatus of claim 1, wherein the apparatus is further configured to include a component to receive an ambient temperature measurement to enable storage of the read temperature indicator in a timeframe associated with a read of stored data.

3. The apparatus of claim 1, wherein the apparatus is further configured to store, in the controller, a write temperature stamp for the at least one predetermined number of bytes of data, wherein the write temperature stamp indicates at least one of:
- an ambient temperature range in a timeframe in which the data is written for storage; and
- documentation of the timeframe in which the data is written for storage.

4. The apparatus of claim 1, wherein the apparatus is further configured to sample ambient temperature sequentially in predetermined time increments to enable storage of the write temperature indicator to indicate an ambient temperature range in a timeframe in which the stored data is written.

5. The apparatus of claim 4, wherein the apparatus is further configured to code subranges of a total temperature range for the write temperature indicator appended as auxiliary data to unused bits of the at least one predetermined number of bytes of the stored data.

6. The apparatus of claim 5, wherein the subranges of the total temperature range are coded with a variable number of bits that define a granularity of the subrange relative to the total temperature range.

7. The apparatus of claim 1, wherein the error rate is a raw bit error rate (RBER).

8. An apparatus, comprising:
- a first component comprising circuitry to determine a raw bit error rate (RBER) during a read of data stored in an array of memory cells;
- a second component comprising circuitry for receipt of an ambient temperature measurement in a timeframe associated with a read of the stored data;
- a write temperature indicator appended as auxiliary data to at least one predetermined number of bytes of the stored data; and
- a controller comprising circuitry and configured to:
  - determine a temperature difference between the write temperature indicator and a read temperature; and
  - refresh a number of memory cells associated with storage of the stored data when an RBER for a read is at least equal to a stored refresh error threshold and the RBER exceeds an RBER expected at a stored temperature difference threshold.

9. The apparatus of claim 8, wherein the apparatus is further configured to store in a lookup table a plurality of temperature difference thresholds associated with a number of RBERs to be expected for a read at each temperature difference threshold.

10. The apparatus of claim 8, wherein the apparatus is further configured to retire a number of memory cells associated with storage of the stored data when an RBER for a read is at least equal to a stored retirement error threshold and the RBER exceeds an RBER expected at a stored temperature difference threshold.

11. The apparatus of claim 8, wherein the apparatus is further configured to not retire a number of memory cells associated with storage of the stored data when an RBER for a read is at least equal to a stored retirement error threshold and the RBER is less than or equal to an RBER expected at a stored temperature difference threshold.

12. The apparatus of claim 8, wherein the apparatus is further configured to not refresh data from a number of memory cells associated with storage of the stored data when an RBER for a read is at least equal to a stored refresh error threshold and the RBER is less than or equal to an RBER expected at a stored temperature difference threshold.

13. A method for temperature related error management, comprising:
- determining that an error rate for a read of stored data is at least equal to a stored threshold; and
- determining that a temperature difference is at least equal to a temperature difference threshold, wherein the temperature difference is determined as a difference between a stored indicator of an ambient temperature in a timeframe in which the stored data was written and a received indicator of an ambient temperature in a timeframe in which the stored data is read;
- performing a first error management operation to retire a number of memory cells associated with storage of the stored data when the error rate is at least equal to a stored retirement threshold and the error rate exceeds an error rate expected at a particular temperature difference threshold corresponding to the ambient temperature;
- performing a second error management operation to not retire the number of memory cells when the error rate is at least equal to the stored retirement threshold and the error rate is less than or equal to the error rate expected at the particular temperature difference threshold corresponding to the ambient temperature;
- performing a third error management operation to refresh the number of memory cells when the error rate is at least equal to a stored refresh error threshold and the error rate exceeds an error rate expected at a stored temperature difference threshold corresponding to the ambient temperature; and
- performing a fourth error management operation to not refresh data from the number of memory cells when the error rate is at least equal to the stored refresh error threshold and the error rate is less than or equal to the error rate expected at a particular temperature difference threshold corresponding to the ambient temperature.

14. The method of claim 13, including:
- evaluating the number of memory cells associated with storage of the stored data by:
  - writing, in a particular ambient temperature range, new data for storage in the number of memory cells and reading, in the particular ambient temperature range, the stored new data to determine a new error rate; and
  - determining, when the new error rate is near a baseline error rate level, that read errors that contributed to being at least equal to the stored retirement threshold are due to the temperature difference.

15. The method of claim 13, including determining particular memory cells to have auxiliary data with a write temperature indicator having a difference from the ambient read temperature indicator that corresponds to a particular read reference voltage adjustment in order to reduce the error rate to preempt determination of one of the first, second, third, and fourth error management operations.

16. The method of claim 13, including updating read reference voltage adjustments in a lookup table to improve a preemption of determination of an error management operation.

17. The method of claim 13, including appending a write temperature indicator as auxiliary data to at least one predetermined number of bytes of the stored data.

18. The method of claim 13, including storing in a lookup table a plurality of temperature difference thresholds each associated with a read reference voltage to be applied in order to reduce read errors associated with a temperature difference induced shift in a voltage threshold for memory cells that store the data.

19. The method of claim 13, including accessing a lookup table and applying, by a controller, a read reference voltage to preemptively reduce read errors associated with the temperature difference.

20. The method of claim 19, wherein the applied read reference voltage differs from a read reference voltage suitable for a read at the temperature at which the stored data was written.

* * * * *